(12) United States Patent
Wu

(10) Patent No.: US 10,869,417 B2
(45) Date of Patent: Dec. 15, 2020

(54) BI-DIRECTIONAL OPTICAL SUB-ASSEMBLY SHIELDING STRUCTURE

(71) Applicant: PEGATRON CORPORATION, Taipei (TW)

(72) Inventor: Kuo-Tai Wu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/835,357

(22) Filed: Mar. 31, 2020

(65) Prior Publication Data

US 2020/0344925 A1 Oct. 29, 2020

(30) Foreign Application Priority Data

Apr. 23, 2019 (TW) .............................. 108114200 A

(51) Int. Cl.
*H05K 9/00* (2006.01)

(52) U.S. Cl.
CPC ......... *H05K 9/0081* (2013.01); *H05K 9/0058* (2013.01)

(58) Field of Classification Search
CPC .................................................. H05K 9/0058
See application file for complete search history.

(56) References Cited

U.S. PATENT DOCUMENTS

| 10,178,817 | B2* | 1/2019 | Zhou ........................ H05K 9/00 |
| 2009/0318025 | A1* | 12/2009 | Kameyama .......... H01R 13/648 |
| | | | 439/607.09 |
| 2012/0288244 | A1* | 11/2012 | Wu ....................... G02B 6/4277 |
| | | | 385/94 |
| 2014/0355997 | A1* | 12/2014 | Miao ...................... H04B 10/40 |
| | | | 398/135 |

FOREIGN PATENT DOCUMENTS

| CN | 202102146 | 1/2012 |
| TW | I297787 | 6/2008 |

* cited by examiner

*Primary Examiner* — Hung V Ngo
(74) *Attorney, Agent, or Firm* — J.C. Patents

(57) ABSTRACT

A bi-directional optical sub-assembly (BOSA) shielding structure is adapted to wrap a BOSA. The BOSA includes a body, and a first terminal group, a second terminal group, and a third terminal group that respectively protrude from different surfaces of the body. The BOSA shielding structure includes a first shielding member and a second shielding member. The first shielding member is adapted to be sleeved on a part of the body close to the first terminal group, so as to separate the first terminal group from the second terminal group and the third terminal group. The second shielding member is disposed adjacent to the first shielding member and adapted to cover the body and the second terminal group, so as to separate the second terminal group from the third terminal group.

9 Claims, 8 Drawing Sheets

BI-DIRECTIONAL OPTICAL SUB-ASSEMBLY SHIELDING STRUCTURE

CROSS-REFERENCE TO RELATED APPLICATION

This non-provisional application claims priority under 35 U.S.C. § 119(a) to Patent Application No. 108114200 filed in Taiwan, R.O.C. on Apr. 23, 2019, the entire contents of which are hereby incorporated by reference.

BACKGROUND

Technical Field

The application relates to a shielding structure, and in particular, to a bi-directional optical sub-assembly shielding structure.

Related Art

A bi-directional optical sub-assembly (BOSA) is an electronic element for converting photoelectric signals. In terms of a BOSA in a form of Triplexer, a body of the BOSA is in a shape of crossed double cylinders, and three terminal groups extending from the body in different directions are included. Signals transmitted by the terminal groups are easily interfered by each other and the outside. Therefore, how to dispose a shielding structure on the BOSA in a special shape to avoid interference to the signals transmitted by the terminals is a target that is intended to be studied currently.

SUMMARY

The application provides a bi-directional optical sub-assembly (BOSA) shielding structure, which can effectively shield electromagnetic interference to three terminal groups of a BOSA.

The BOSA shielding structure in the application is adapted to wrap a BOSA. The BOSA includes a body, and a first terminal group, a second terminal group, and a third terminal group that respectively protrude from different surfaces of the body. The BOSA shielding structure includes a first shielding member and a second shielding member. The first shielding member is adapted to be sleeved on a part of the body close to the first terminal group, so as to separate the first terminal group from the second terminal group and the third terminal group. The second shielding member is disposed adjacent to the first shielding member and adapted to cover the body and the second terminal group, so as to separate the second terminal group from the third terminal group.

In an embodiment of the application, the first shielding member includes a first side plate and a bottom plate connected to the first side plate in a bent manner, where the bottom plate is adapted to be located below the body. The first side plate has a hole, the part of the body close to the first terminal group is adapted to pass through the hole, and the first terminal group is exposed outside the first shielding member.

In an embodiment of the application, the first shielding member further includes an annular wall that is located on an edge of the hole of the first side plate and that inwardly protrudes from the first side plate, where the annular wall is located above the bottom plate. The body of the BOSA includes a first cylinder and a second cylinder arranged in a cross shape. The first terminal group and the second terminal group respectively protrude from two opposite end surfaces of the first cylinder, and the annular wall is sleeved on a portion of the first cylinder close to the first terminal group.

In an embodiment of the application, the first shielding member further includes a second side plate connected to the bottom plate in a bent manner. The BOSA further includes a bi-directional optical port. The third terminal group and the bi-directional optical port respectively protrude from two opposite end surfaces of the second cylinder, and a portion of the second cylinder close to the bi-directional optical port leans against the second side plate.

In an embodiment of the application, the bottom plate includes a first bottom plate surface and a second bottom plate surface opposite to each other, where the first bottom plate surface is adapted to face the body. The bottom plate further includes a plurality of first fixing portions outwardly protruding from the second bottom plate surface.

In an embodiment of the application, the second shielding member includes a top plate and a partition plate connected to the top plate, where the top plate is located above the body and the second terminal group, and the partition plate is disposed between the second terminal group and the third terminal group and configured to separate the second terminal group from the third terminal group.

In an embodiment of the application, the first shielding member includes a first side plate and a bottom plate connected to the first side plate in a bent manner. The first side plate, the bottom plate, the top plate and the partition plate jointly form a first chamber, and a portion of the third terminal group is located in the first chamber.

In an embodiment of the application, the second shielding member further includes a plurality of third side plates connected to the top plate. The top plate, the third side plates and the partition plate jointly form a second chamber, and the second terminal group is located in the second chamber.

In an embodiment of the application, the body of the BOSA includes a first cylinder and a second cylinder arranged in a cross shape. The BOSA includes a bi-directional optical port protruding from the second cylinder. One of the third side plates includes a notch, the second cylinder is located in the notch, and the bi-directional optical port extends out of the notch.

In an embodiment of the application, the third side plates include a plurality of second fixing portions, and the second fixing portions extend in a direction away from the top plate.

Based on the above, the BOSA shielding structure in the application uses a two-piece design. The first shielding member is adapted to be sleeved on the part of the body close to the first terminal group, so as to separate the first terminal group from the second terminal group and the third terminal group. The second shielding member is disposed adjacent to the first shielding member and adapted to cover the body and the second terminal group, so as to separate the second terminal group from the third terminal group. In this way, the BOSA shielding structure in the application has a simple structure, can be well fixed on a BOSA in a special shape, and can effectively shield the electromagnetic interference to the three terminal groups.

To make the above features and advantages of the application more obvious and understandable, detailed description is provided below with reference to the accompanying drawings by using embodiments.

DETAILED DESCRIPTION OF THE EMBODIMENTS

Figure 1:
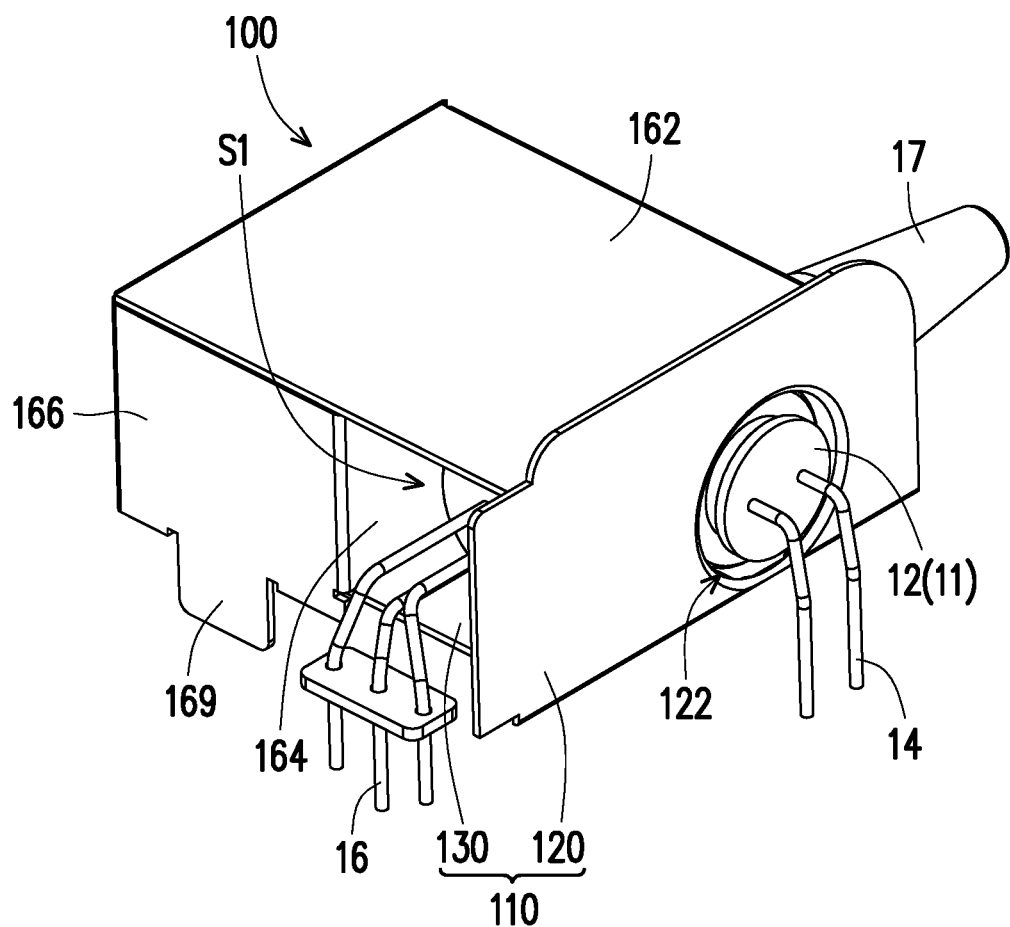
FIG. 1 a schematic diagram of a bi-directional optical sub-assembly (BOSA) shielding structure disposed on a BOSA according to an embodiment of the application.
Figure 2:
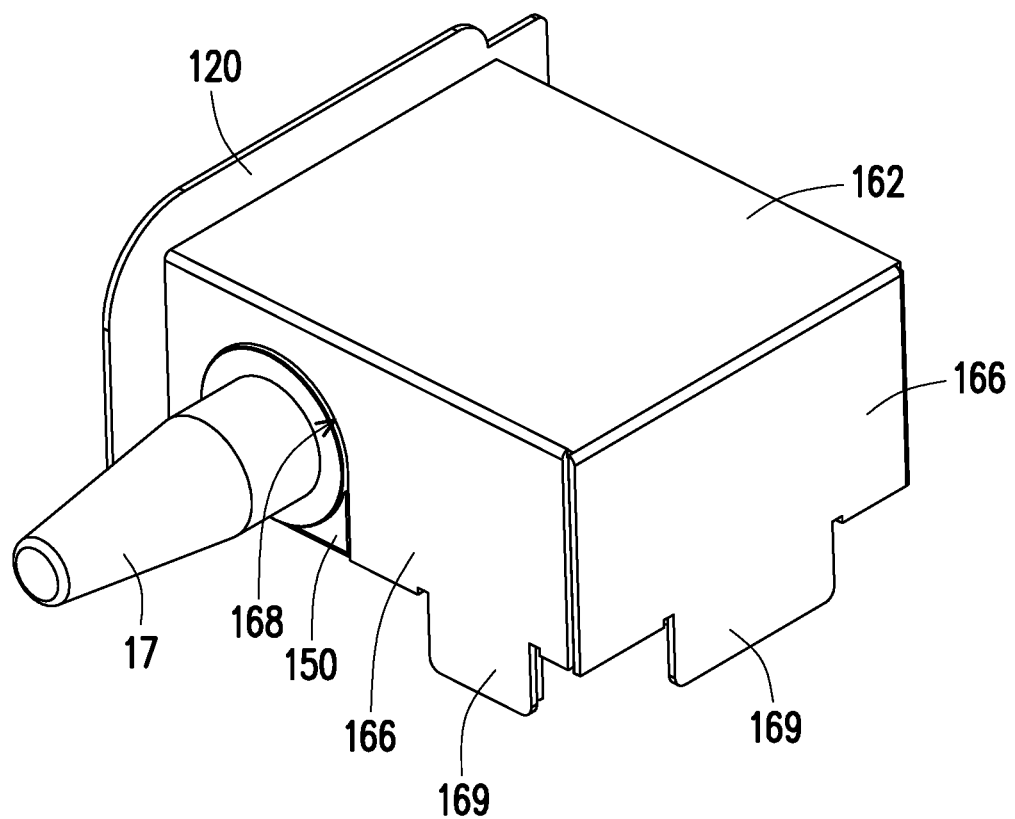
FIG. 2 and FIG. 3 are schematic diagrams of FIG. 1 from other angles of view.
Figure 3:
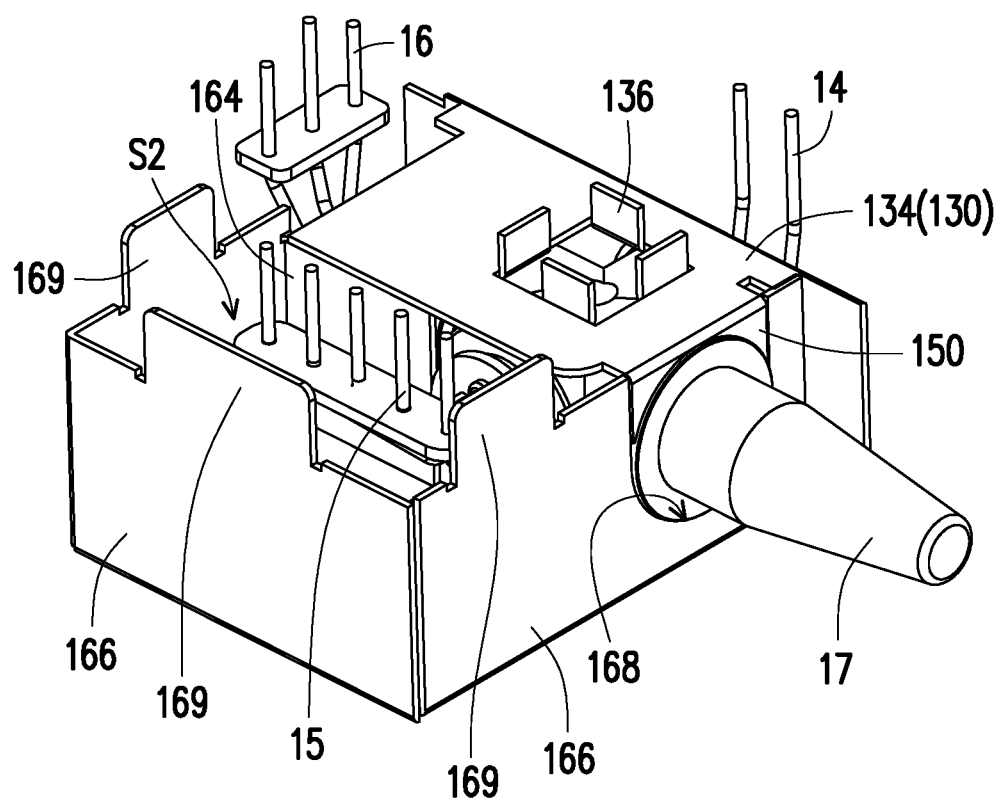
Figure 4A:
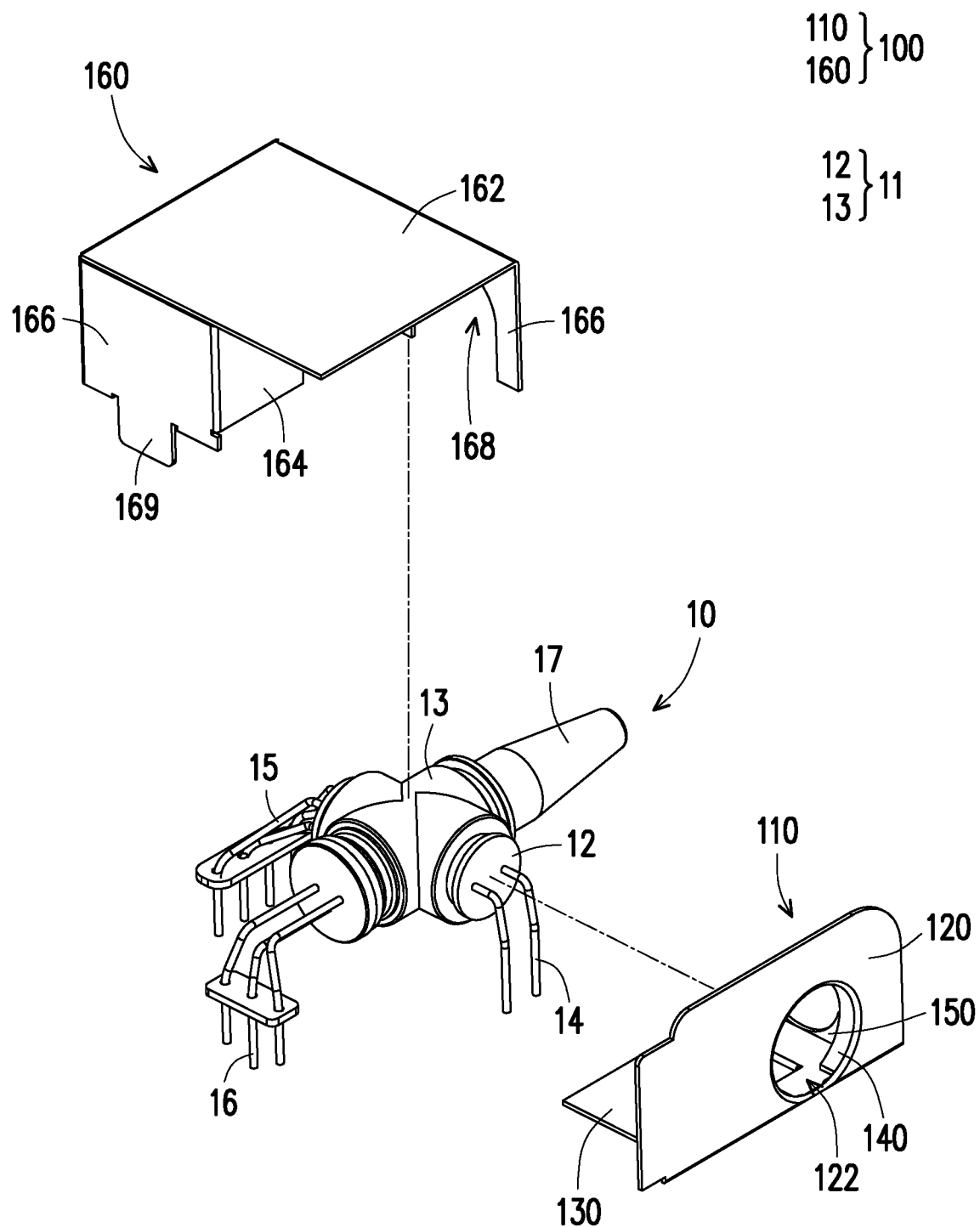
FIG. 4A is an schematic exploded view of the BOSA shielding structure in FIG. 1.
Figure 4B:
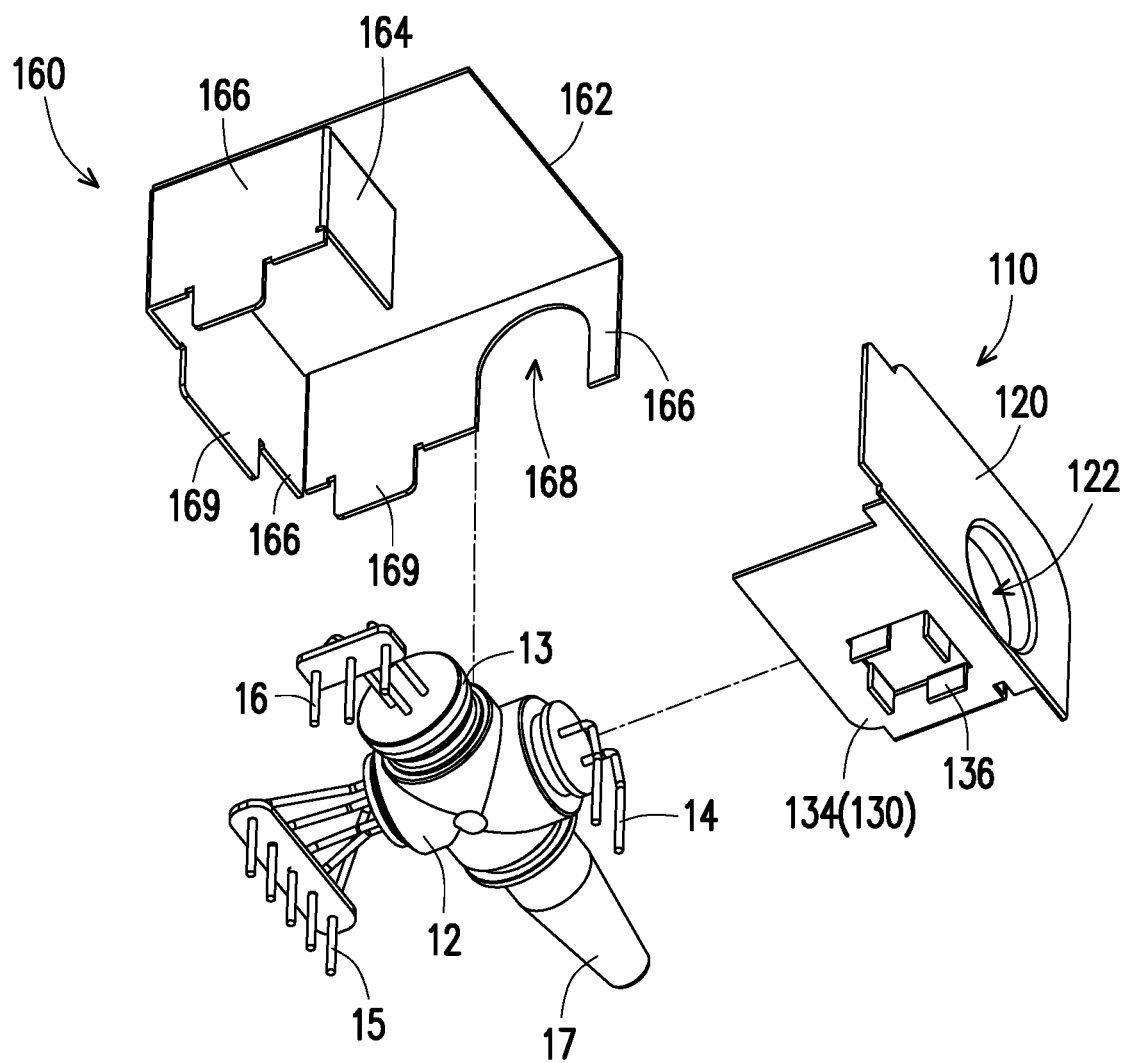
FIG. 4B and FIG. 5 are schematic diagrams of FIG. 4A from other angles of view.
Figure 5:
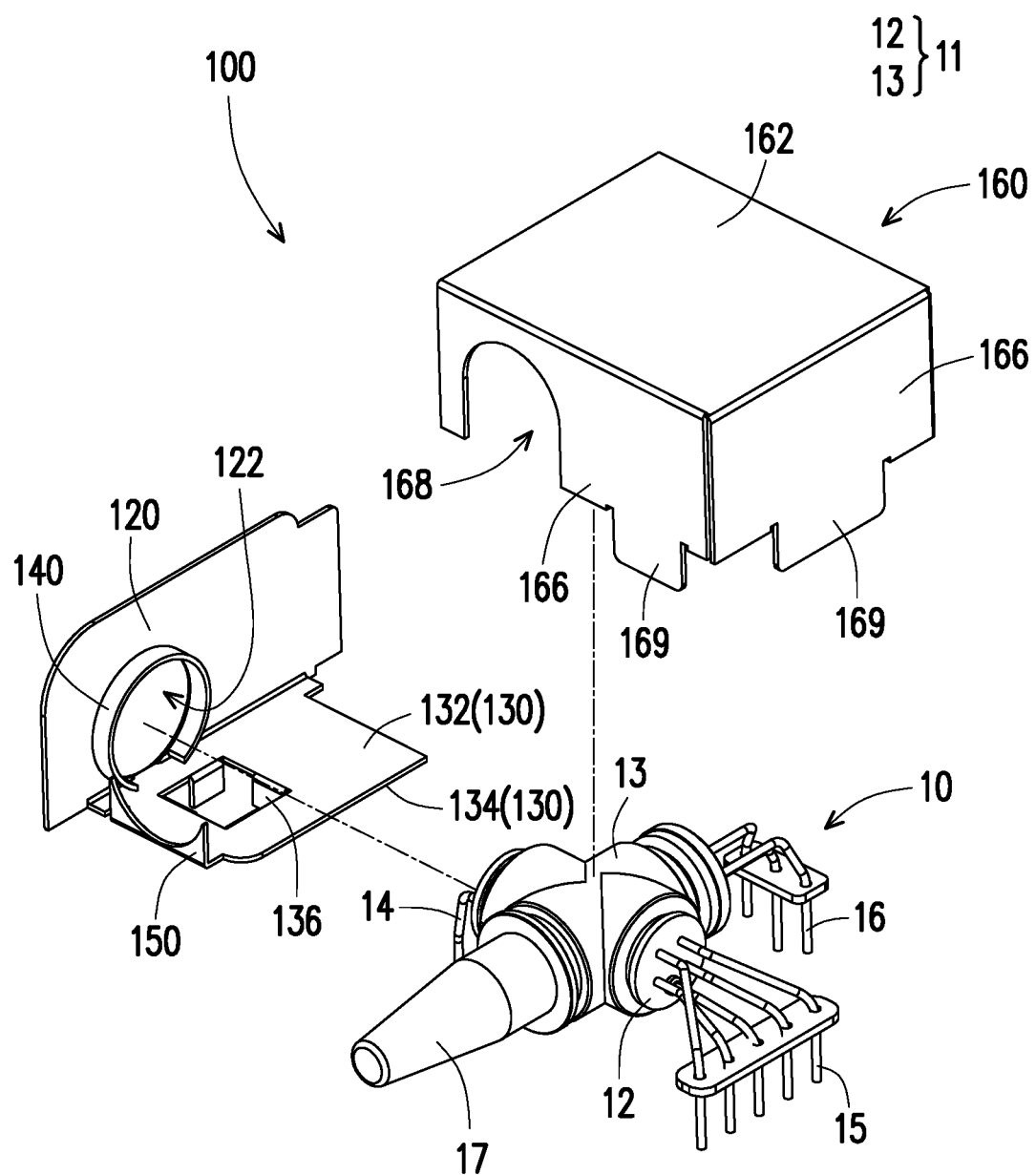

FIG. 1 a schematic diagram of a bi-directional optical sub-assembly (BOSA) shielding structure disposed on a BOSA according to an embodiment of the application. FIG. 2 and FIG. 3 are schematic diagrams of FIG. 1 from other angles of view. FIG. 4A is a schematic exploded view of the BOSA shielding structure in FIG. 1. FIG. 4B and FIG. 5 are schematic diagrams of FIG. 4A from other angles of view.

Referring to FIG. 1 to FIG. 5, a BOSA shielding structure 100 in this embodiment is adapted to wrap a BOSA 10 (FIG. 4A). It can be seen from FIG. 4A and FIG. 5 that, in this embodiment, the BOSA 10, for example, is in a form of Triplexer. The BOSA 10 includes a body 11, a first terminal group 14, a second terminal group 15, and a third terminal group 16 that protrude from different surfaces of the body 11, and a bi-directional optical port 17. In this embodiment, the body 11 of the BOSA 10 includes a first cylinder 12 and a second cylinder 13 arranged in a cross shape. The first terminal group 14 and the second terminal group 15 respectively protrude from two opposite end surfaces of the first cylinder 12. The third terminal group 16 and the bi-directional optical port 17 respectively protrude from two opposite end surfaces of the second cylinder 13.

It can be known from FIG. 4A, FIG. 4B, and FIG. 5 that, the body 11 of the BOSA 10 has a relatively complex shape. The BOSA shielding structure 100 is described below, which may be well fixed on the BOSA 10 in a quite simple structure and may effectively shield electromagnetic interference to three terminal groups of the BOSA 10.

Figure 6:
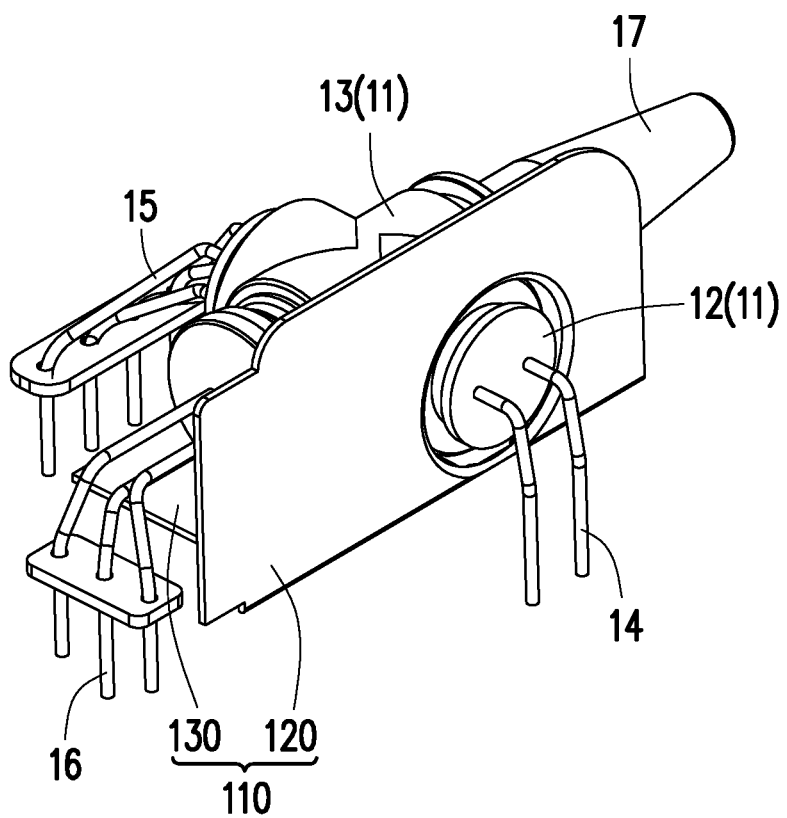
FIG. 6 is a schematic diagram of hiding a second shielding member of the BOSA shielding structure in FIG. 1.
Figure 7:
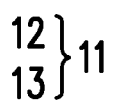
FIG. 7 is a schematic diagram of FIG. 6 from other angles of view.
Figure 7:
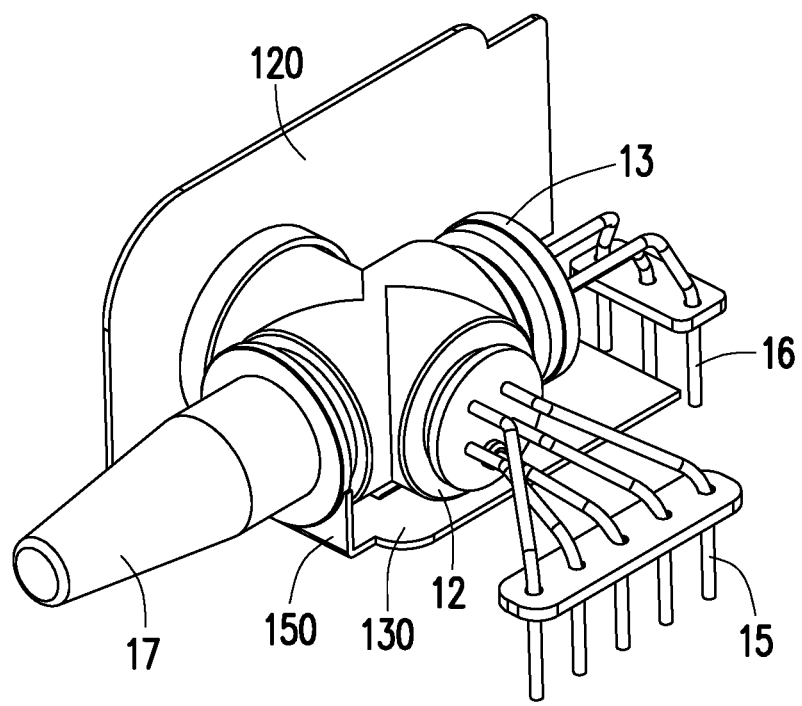

In this embodiment, the BOSA shielding structure 100 includes a first shielding member 110 (FIG. 4A) and a second shielding member 160. FIG. 6 is a schematic diagram of hiding a second shielding member of the BOSA shielding structure in FIG. 1. FIG. 7 is a schematic diagram of FIG. 6 from other angles of view. Referring to FIG. 4A to FIG. 7, the first shielding member 110 is adapted to be sleeved on a part of the body 11 close to the first terminal group 14, so as to separate the first terminal group 14 from the second terminal group 15 and the third terminal group 16.

Specifically, as shown in FIG. 5, in this embodiment, the first shielding member 110 includes a first side plate 120, a bottom plate 130 connected to the first side plate 120 in a bent manner, and a second side plate 150 connected to the bottom plate 130 in a bent manner. The bottom plate 130 is adapted to be located below the body 11. In this embodiment, a top edge of the second side plate 150 is arc-shaped. A portion of the second cylinder 13 close to the bi-directional optical port 17 leans against the second side plate 150.

As shown in FIG. 4A and FIG. 6, in this embodiment, the first side plate 120 has a hole 122. A portion of the first cylinder 12 of the body 11 close to the first terminal group 14 is adapted to pass through the hole 122, and the first terminal group 14 is exposed outside the first shielding member 110.

In addition, as shown in FIG. 5 and FIG. 7, in this embodiment, the first shielding member 110 further includes an annular wall 140, where the annular wall 140 is located on an edge of the hole 122 of the first side plate 120 and protrudes from the first side plate 120. The annular wall 140 is located above the bottom plate 130, and the annular wall 140 is sleeved on the portion of the first cylinder 12 close to the first terminal group 14.

In this embodiment, the annular wall 140, for example, is drawn from the first shielding member 110 through a sheet medal drawing process to accommodate the first cylinder 12. During assembling, after the first cylinder 12 passes through the annular wall 140, the first shielding member 110 may be fixed on the first cylinder 12 through laser welding or in other fixing manner.

Because the first terminal group 14 may extend out of the first side plate 120, the first side plate 120 may separate the first terminal group 14 from the second terminal group 15 and the third terminal group 16, thereby avoiding interference of the second terminal group 15 and the third terminal group 16 to the first terminal group 14. In addition, in this embodiment, because signals transmitted by the first terminal group 14 are affected heavily by the electromagnetic interference, after being assembled to the BOSA 10, the BOSA shielding structure 100 may cover a housing (not depicted) of an electronic device on the first terminal group 14, so as to further provide electromagnetic shielding for the first terminal group 14.

In addition, as shown in FIG. 1 and FIG. 3, in this embodiment, the second shielding member 160 is disposed adjacent to the first shielding member 110 and adapted to cover the body 11 and the second terminal group 15, so as to separate the second terminal group 15 from the third terminal group 16. Specifically, as shown in FIG. 3 to FIG. 5, in this embodiment, the second shielding member 160 includes a top plate 162, a partition plate 164 (FIG. 3) connected to the top plate 162, and a plurality of third side plates 166 connected to the top plate 162. The top plate 162 is located above the body 11 and the second terminal group 15. The partition plate 164 (FIG. 3) is disposed between the second terminal group 15 and the third terminal group 16 and configured to separate the second terminal group 15 from the third terminal group 16. In this embodiment, a quantity of the third side plates 166, for example, is three, but is not limited thereto. Every two third side plates 166 are connected, and the partition plate 164 is connected to one of the third side plates 166.

Referring to FIG. 1 again, in this embodiment, the first side plate 120, the bottom plate 130, the top plate 162, and the partition plate 164 jointly form a first chamber S1, and a portion of the third terminal group 16 is located in the first chamber S1. In this embodiment, because signals transmitted by the third terminal group 16 are less affected by the electromagnetic interference, a periphery of the third terminal group 16 does not need to be shielded by an extra housing, and a portion of the third terminal group 16 may be exposed.

In addition, as shown in FIG. 3, in this embodiment, the top plate 162, the third side plates 166, and the partition plate 164 jointly form a second chamber S2. The second terminal group 15 is located in the second chamber S2, and is covered and surrounded by the top plate 162, the third side plates 166, and the partition plate 164. In this embodiment, because signals transmitted by the second terminal group 15 are affected heavily by the electromagnetic interference, the design that the second terminal group 15 is surrounded by the top plate 162, the third side plates 166, and the partition plate 164 can effectively reduce a probability of interference to the signals transmitted by the second terminal group 15.

In addition, in this embodiment, one of the third side plates 166 of the second shielding member 160 includes a notch 168. A portion of the second cylinder 13 close to the bi-directional optical port 17 is located in the notch 168, and the bi-directional optical port 17 extends out of the notch 168. In other words, in this embodiment, an annular hole is enclosed by the second side plate 150 of the first shielding member 110 and one of the third side plates 166, so as to fix the portion of the second cylinder 13 close to the bi-directional optical port 17.

In addition, as shown in FIG. 5, the bottom plate 130 of the first shielding member 110 includes a first bottom plate surface 132 and a second bottom plate surface 134, where the first bottom plate surface 132 is adapted to face the body 11. As shown in FIG. 3, in this embodiment, the bottom plate 130 further includes a plurality of first fixing portions 136 outwardly protruding from the second bottom plate surface 134. In addition, the third side plates 166 include a plurality of second fixing portions 169, where the second fixing portions 169 extend in a direction away from the top plate 162. In this embodiment, when the BOSA shielding structure 100 is assembled to the BOSA 10, the BOSA shielding structure 100 and the BOSA 10 may be welded to or inserted in a circuit board (not depicted) through the first fixing portions 136 and the second fixing portions 169.

In this embodiment, the BOSA shielding structure 100 is combined by connecting the first shielding member 110 and the second shielding member 160, so that the BOSA shielding structure 100 can be fixed on the BOSA 10 in a specific shape in a simple and convenient manner and may separate the first terminal group 14 from the second terminal group 15 and the third terminal group 16. The first shielding member 110 and the second shielding member 160, for example, are made of metal plates in manners such as bending and stamping. The first shielding member 110 and the second shielding member 160 may be fixed on each other or/and fixed on the BOSA 10 in manners such as welding, bonding, and locking. With such a design, the BOSA shielding structure 100 may have a simple structure, be convenient to be assembled, have relatively low costs, and may well wrap the BOSA 10. Definitely, the manufacturing process and the fixing manner of the first shielding member 110 and the second shielding member 160 are not limited thereto.

In conclusion, the BOSA shielding structure in the application uses a two-piece design. The first shielding member is adapted to be sleeved on the part of the body close to the first terminal group, so as to separate the first terminal group from the second terminal group and the third terminal group. The second shielding member is disposed adjacent to the first shielding member and adapted to cover the body and the second terminal group, so as to separate the second terminal group from the third terminal group. In this way, the BOSA shielding structure in the application has a simple structure, can be well fixed on a BOSA in a special shape, and can effectively shield the electromagnetic interference to the three terminal groups.

Although the application has been disclosed above by using the embodiments, the embodiments are not used to limit the application. Any person skilled in the art may make some variations and improvements without departing from the spirit and scope of the application. Therefore, the protection scope of the application shall be subject to the appended claims.

What is claimed is:

1. A bi-directional optical sub-assembly (BOSA) shielding structure, adapted to wrap a BOSA, wherein the BOSA comprises: a body, and a first terminal group, a second terminal group, and a third terminal group that respectively protrude from different surfaces of the body, and the BOSA shielding structure comprises:
    a first shielding member, adapted to be sleeved on a part of the body close to the first terminal group, so as to separate the first terminal group from the second terminal group and the third terminal group; and
    a second shielding member, disposed adjacent to the first shielding member and adapted to cover the body and the second terminal group, so as to separate the second terminal group from the third terminal group,
    wherein the second shielding member comprises a top plate and a partition plate connected to the top plate, the top plate is located above the body and the second terminal group, and the partition plate is disposed between the second terminal group and the third terminal group and configured to separate the second terminal group from the third terminal group.

2. The BOSA shielding structure according to claim 1, wherein the first shielding member comprises a first side plate and a bottom plate connected to the first side plate in a bent manner, the bottom plate is adapted to be located below the body, the first side plate has a hole, the part of the body close to the first terminal group is adapted to pass through the hole, and the first terminal group is exposed outside the first shielding member.

3. The BOSA shielding structure according to claim 2, wherein the first shielding member further comprises an annular wall that is located on an edge of the hole of the first side plate and that inwardly protrudes from the first side plate, the annular wall is located above the bottom plate, the body of the BOSA comprises a first cylinder and a second cylinder arranged in a cross shape, the first terminal group and the second terminal group respectively protrude from two opposite end surfaces of the first cylinder, and the annular wall is sleeved on a part of the first cylinder close to the first terminal group.

4. The BOSA shielding structure according to claim 3, wherein the first shielding member further comprises a second side plate connected to the bottom plate in a bent manner, the BOSA further comprises a bi-directional optical port, the third terminal group and the bi-directional optical port respectively protrude from two opposite end surfaces of the second cylinder, and a part of the second cylinder close to the bi-directional optical port leans against the second side plate.

5. The BOSA shielding structure according to claim 2, wherein the bottom plate comprises a first bottom plate surface and a second bottom plate surface opposite to each other, the first bottom plate surface is adapted to face the body, and the bottom plate further comprises a plurality of first fixing portions outwardly protruding from the second bottom plate surface.

6. The BOSA shielding structure according to claim 1, wherein the first shielding member comprises a first side plate and a bottom plate connected to the first side plate in a bent manner, the first side plate, the bottom plate, the top plate and the partition plate jointly form a first chamber, and a portion of the third terminal group is located in the first chamber.

7. The BOSA shielding structure according to claim 1, wherein the second shielding member further comprises a plurality of third side plates connected to the top plate, the top plate, the third side plates and the partition plate jointly form a second chamber, and the second terminal group is located in the second chamber.

8. The BOSA shielding structure according to claim 7, wherein the body of the BOSA comprises a first cylinder and a second cylinder arranged in a cross shape, the BOSA comprises a bi-directional optical port protruding from the second cylinder, one of the third side plates comprises a notch, the second cylinder is located in the notch, and the bi-directional optical port extends out of the notch.

9. The BOSA shielding structure according to claim 7, wherein the third side plates comprise a plurality of second fixing portions, and the second fixing portions extend in a direction away from the top plate.

\* \* \* \* \*